United States Patent
Fong et al.

(10) Patent No.: US 9,882,588 B2
(45) Date of Patent: Jan. 30, 2018

(54) MATCHING NETWORK FOR LOAD LINE CHANGE

(71) Applicant: MediaTek Inc., Hsin-Chu (TW)

(72) Inventors: Keng Leong Fong, Sunnyvale, CA (US); Wei-Kai Hong, New Taipei (TW); Ming Chung Liu, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/138,365

(22) Filed: Apr. 26, 2016

(65) Prior Publication Data

US 2017/0012653 A1    Jan. 12, 2017

Related U.S. Application Data

(60) Provisional application No. 62/188,749, filed on Jul. 6, 2015.

(51) Int. Cl.
*H04B 1/04* (2006.01)
*H03F 1/02* (2006.01)
(Continued)

(52) U.S. Cl.
CPC ......... *H04B 1/0458* (2013.01); *H03F 1/0277* (2013.01); *H03F 1/08* (2013.01);
(Continued)

(58) Field of Classification Search
CPC ......... H04B 1/04; H04B 1/0458; H03F 3/195; H03F 3/213; H03F 3/211; H03F 1/0277; H03F 1/08; H03F 3/45071; H03F 2200/451; H03F 2200/387; H03F 2200/541; H03F 2203/21139; H03F 2203/45228
See application file for complete search history.

(56) References Cited

U.S. PATENT DOCUMENTS 8,269,561 B1    9/2012  Park et al.
9,020,453 B2 *  4/2015  Briffa ................... H04B 1/04
                                                330/124 R
(Continued)

FOREIGN PATENT DOCUMENTS

CN    101478291 A    7/2009
CN    101656509 A    2/2010
(Continued)

OTHER PUBLICATIONS

EP 16178064.8, Nov. 18, 2016, Partial European Search Report.
(Continued)

*Primary Examiner* — Thanh Le
(74) *Attorney, Agent, or Firm* — Wolf, Greenfield & Sacks, P.C.

(57) ABSTRACT

An amplifier circuit that includes a first power amplifier configured to drive a load and a second power amplifier configured to drive the load through an impedance step-up network. The impedance step-up network is connected to an output of the second power amplifier. The impedance step-up network is configured to switch into a first mode to present an increased impedance to the first power amplifier, and switch into a second mode in which the impedance step-up network steps-up an impedance seen by the second power amplifier looking into the impedance step-up network.

27 Claims, 7 Drawing Sheets

(51) Int. Cl.
  *H03F 1/56*     (2006.01)
  *H03F 3/189*    (2006.01)
  *H03F 1/08*     (2006.01)
  *H03F 3/195*    (2006.01)
  *H03F 3/21*     (2006.01)
  *H03F 3/213*    (2006.01)
  *H03F 3/45*     (2006.01)

(52) U.S. Cl.
  CPC ............... *H03F 1/56* (2013.01); *H03F 3/189* (2013.01); *H03F 3/195* (2013.01); *H03F 3/211* (2013.01); *H03F 3/213* (2013.01); *H03F 3/45071* (2013.01); *H03F 2200/387* (2013.01); *H03F 2200/451* (2013.01); *H03F 2200/541* (2013.01); *H03F 2203/21139* (2013.01); *H03F 2203/45228* (2013.01)

(56) References Cited

U.S. PATENT DOCUMENTS

| | | |
|---|---|---|
| 2005/0156671 A1 | 7/2005 | Shanjani et al. |
| 2006/0028269 A1* | 2/2006 | Chen .................. H03F 1/0277 330/51 |
| 2012/0154054 A1 | 6/2012 | Kaczman et al. |
| 2013/0027132 A1 | 1/2013 | Retz et al. |
| 2013/0265111 A1 | 10/2013 | Ota et al. |
| 2014/0073271 A1 | 3/2014 | Ilkoy et al. |
| 2014/0167853 A1 | 6/2014 | Haruna et al. |
| 2014/0292414 A1* | 10/2014 | Vice ........................ H03F 3/211 330/295 |

FOREIGN PATENT DOCUMENTS

| | | |
|---|---|---|
| EP | 2466748 A1 | 6/2012 |
| JP | 2013026988 A | 2/2013 |

OTHER PUBLICATIONS

Partial European Search Report for Application No. 16178064.8 dated Nov. 18, 2016.

Ichiro et al., Fully integrated CMOS power amplifier design using the distributed active-transformer architecture. IEEE Journal of Solid-State Circuits. Mar. 2002; 37(3): 371-83.

Extended European Search Report for Application No. EP 16178064.8 dated Feb. 17, 2017.

Aoki et al., Fully integrated CMOS Power Amplifier Design Using the Distributed Active-Transformer Architecture. IEEE Journal of Solid-State Circuits. Mar. 2002;37(3):371-83.

* cited by examiner

MATCHING NETWORK FOR LOAD LINE CHANGE

CROSS-REFERENCE TO RELATED APPLICATIONS

This application claims priority to U.S. provisional application Ser. No. 62/188,749, titled "MATCHING NETWORK FOR LOAD LINE CHANGE TO ENHANCE POWER EFFICIENCY OF MID-POWER MODE OF PA," filed Jul. 6, 2015, which is hereby incorporated by reference in its entirety.

BACKGROUND

1. Technical Field

The techniques described herein relate to power amplifiers and to an impedance step-up network for stepping up the impedance seen at the output of a power amplifier.

2. Discussion of the Related Art

Power amplifiers are used for driving antennas to transmit radio frequency signals. Amplifiers with different power driving capabilities may be used for driving transmission at different power levels.

SUMMARY

Some embodiments relate to an amplifier circuit that includes a first power amplifier configured to drive a load and a second power amplifier configured to drive the load through an impedance step-up network. The impedance step-up network is connected to an output of the second power amplifier. The impedance step-up network is configured to switch into a first mode to present an increased impedance to the first power amplifier, and switch into a second mode in which the impedance step-up network steps-up an impedance seen by the second power amplifier looking into the impedance step-up network.

Some embodiments relate to an impedance step-up network for a power amplifier. The impedance step-up network includes an inductor and a first capacitor that step up the impedance seen at an output of the power amplifier looking into the impedance step-up network. The impedance step-up network also includes a second capacitor configured to be selectively connected in parallel with the inductor, and a switch in series with the second capacitor. The switch is turned off when the power amplifier drives a load and turned on when the power amplifier does not drive the load.

Some embodiments relate to a method of operating an amplifier circuit that includes a first power amplifier configured to drive a load, a second power amplifier configured to drive the load and an impedance step-up network connected to an output of the second power amplifier. The method includes switching the impedance step-up network into a first mode to present an increased impedance to the first power amplifier. The method also includes switching the impedance step-up network into a second mode in which the impedance step-up network steps-up an impedance seen by the second power amplifier looking into the impedance step-up network.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

The inventors have recognized and appreciated that when multiple power amplifiers are coupled to an antenna, power amplifiers designed to deliver different levels of power operate best at different load line impedances. However, the load line impedance is typically designed for the high-power amplifier, which may be sub-optimal for a low- or mid-power amplifier connected to the same load line. In a class A amplifier, for example, the power efficiency η is given by the following equations.

$$\eta = 0.5 \frac{V_{swing}}{V_{cc}} = 0.5 \frac{\sqrt{P_{out}R}}{V_{cc}}$$

Thus, for low or mid power amplifiers, power efficiency can be improved by decreasing the supply voltage $V_{cc}$ or increasing the load line resistance R. However, using a switching regulator to change the $V_{cc}$ is not cost nor form-factor effective, and hence changing the load line resistance R become the only alternative. Matching networks may be used to increase the load line resistance R. However, the inventors have recognized and appreciated a matching network for one amplifier can load the output of another amplifier. For example, adding a step-up network to the output of a low or mid power amplifier can load the output of the high-power amplifier, which can cause power dissipation.

The circuits and techniques described herein relate to impedance step-up networks (also referred-to as "step-up networks") that can be controlled to present a high impedance when the step-up network is not being used, which can prevent the loading of another amplifier which would reduce efficiency. In some embodiments, an impedance step-up network can be connected to the output of a power amplifier to increase the impedance seen at the output of the power amplifier looking into the impedance step-up network. The impedance step-up network may include a capacitor and inductor. When the power amplifier is not being used, another capacitor can be switched into the network to resonate in parallel with the inductor, thereby preventing the impedance step-up network from loading the output of another amplifier.

Figure 1A:
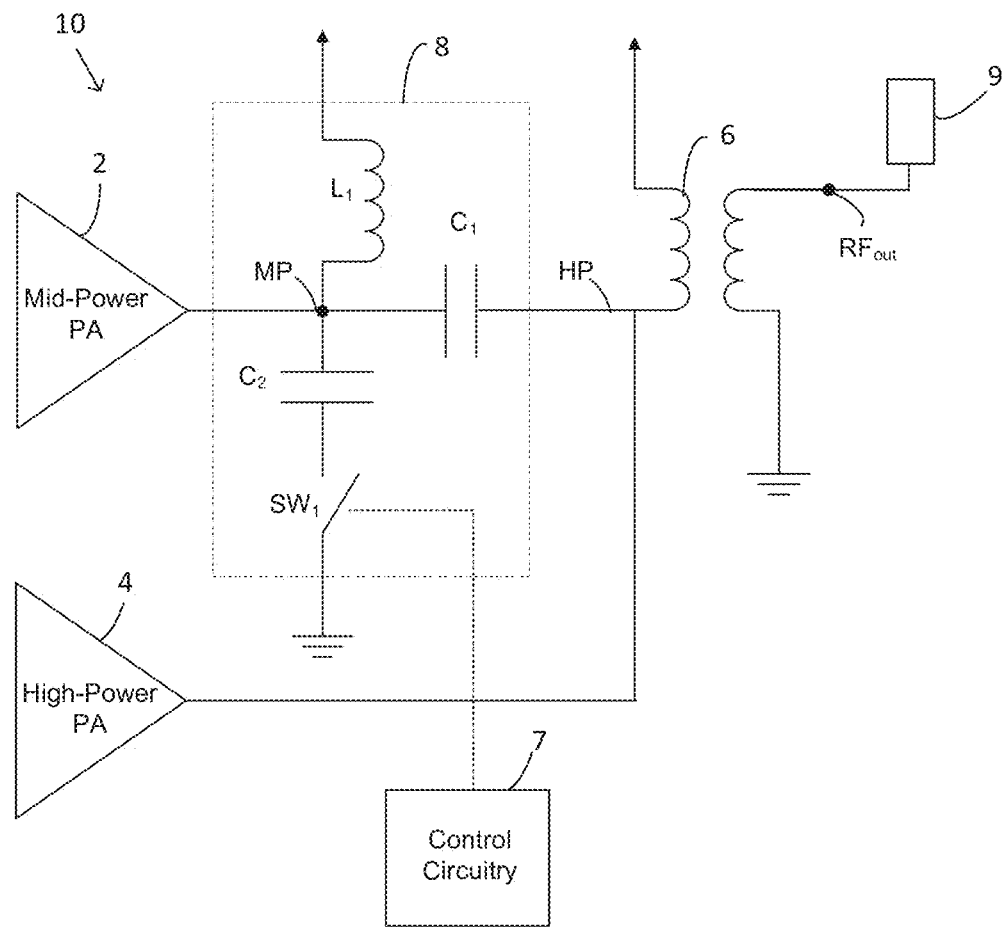
FIG. 1A shows an amplifier circuit having a mid-power power amplifier and a high-power power amplifier that can drive a load, which may be an antenna.

FIG. 1A shows an amplifier circuit 10 having a mid-power power amplifier (PA) 2 and a high-power power amplifier (PA) 4 that can drive a load 9, which may be an antenna. The output HP of the high-power PA 4 is connected to an input terminal of a balun 6. The output MP of the mid-power PA 2 is connected to the input terminal of balun 6 through an impedance step-up network 8 (hereinafter a "step-up network"). Step-up network 8 includes a step-up capacitor $C_1$, a step-up inductor $L_1$, a resonant capacitor $C_2$ and a switch $SW_1$. Step-up inductor $L_1$ is connected between terminal MP and a power supply voltage (as represented by the arrow pointing upward). The resonant capacitor $C_2$ is connected between terminal MP and switch $SW_1$. The amplifier circuit 10 also includes control circuitry 7 to control the switch $SW_1$.

When the mid-power PA 2 is turned on to drive the load 9, the high-power PA 4 is turned off. Switch $SW_1$ is controlled to be open, which disconnects resonant capacitor $C_2$ from the circuit. The inductor $L_1$ and capacitor $C_1$ step up the impedance seen by the output of the mid-power PA 2. For example, the impedance seen at the input terminal of the balun 6, looking into the balun 6, may be 10Ω, and the step-up network 8 may increase this impedance by a step-up factor (e.g., multiple) of ten so that the output of the mid-power PA 2 sees an impedance of 100Ω looking into the step up-network 8. However, these impedances and step-up factor are provided merely by way of example, as the techniques described herein are not limited as to specific impedance values or increasing the impedance by any particular multiple. As discussed above, stepping up the impedance seen at the output of the mid-power PA 2 may increase its efficiency.

When the high-power PA 4 is turned on to drive the load 9, the mid-power PA 2 is turned off. Switch $SW_1$ is closed, which connects resonant capacitor $C_2$ in parallel with inductor $L_1$ from an alternating current (AC) perspective, as the power supply terminal is an AC ground. Capacitor $C_2$ resonates with inductor $L_1$, which increases the impedance seen by the high-power PA 4 looking into the step-up network 8. By increasing the impedance seen by the high-power PA 4 looking into the network, the step-up network 8 reduces its loading at node HP. In such a way, the step-up network 8 appears like an open circuit to the high-power PA 4. This prevents the step-up network 8 from loading the output of the high-power PA 4. In some embodiments, the values of $L_1$ and $C_2$ are selected such that the resonant frequency of the step-up network is within the range of 90% to 110% of the center frequency of the output signal produced by the power amplifier, which may be a narrowband signal in some embodiments. However, the techniques described herein are not limited as to particular frequencies or frequency ranges.

The power amplifiers described herein may be implemented as class A amplifiers, in some embodiments. However, the techniques described herein are not limited in this respect, as the power amplifiers may be implemented using any suitable class or type of amplifier circuit.

Control circuitry 7 may be any suitable analog or digital hardware, such a control circuit, microprocessor, a microcontroller, or any other suitable circuitry. Control circuitry 7 may be implemented in hardware or a combination of hardware and software.

To control switch $SW_1$, control circuitry 7 may determine which PA is transmitting. This determination may made by examining the control inputs of the PAs. The control circuitry may receive signals representing the control inputs of the PAs and make the determination as to which PA is transmitting, and then control switch $SW_1$ based on this information. For example, control circuitry 7 may open switch $SW_1$ in response to determining that the mid-power PA 2 is transmitting and close switch $SW_1$ in response to determining that the high-power PA 4 is transmitting.

Figure 1B:
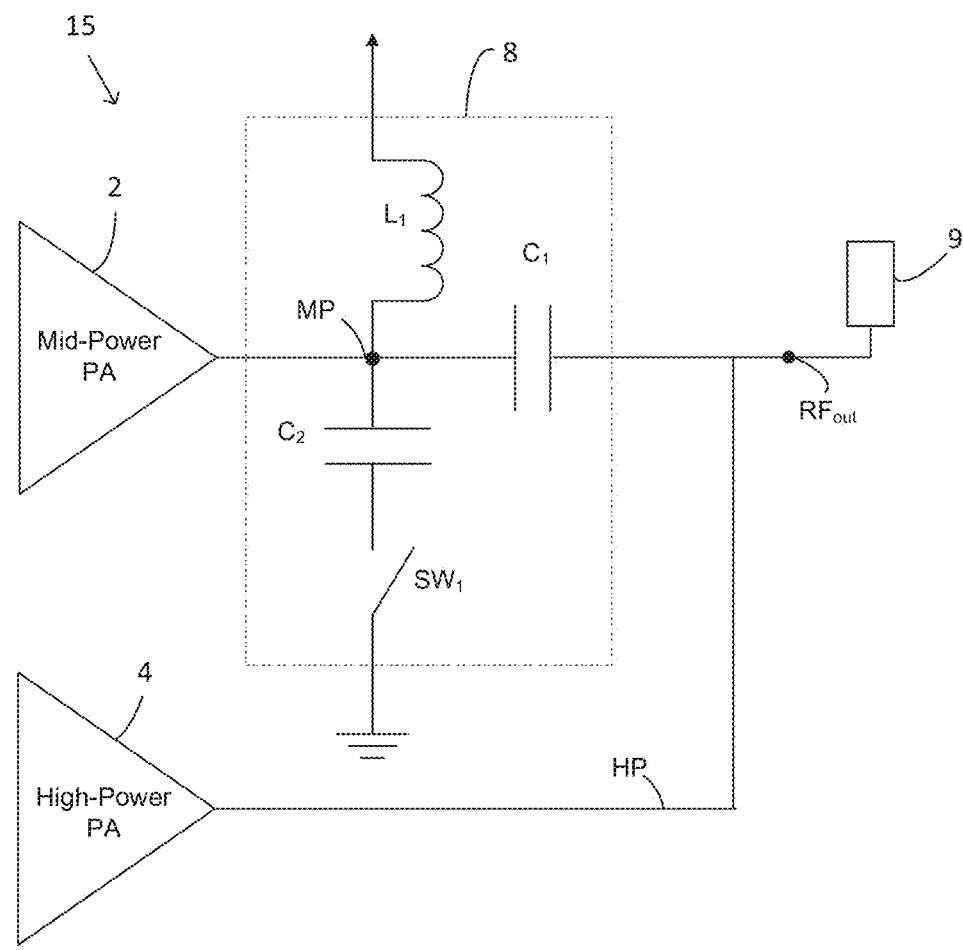
FIG. 1B shows an amplifier circuit similar to amplifier circuit of FIG. 1A, but without a balun or LC transformer network.

In some embodiments, a LC transformer network may be used in place of balun 6. The term "transformer network" is used herein to refer to a balun, a LC transformer network, or any combination thereof. In some embodiments, the amplifier circuit may not include a balun or LC transformer network, as illustrated in FIG. 1B FIG. 1B shows an amplifier circuit 15 similar to amplifier circuit 10 of FIG. 1A, but without a balun 6 or LC transformer network. In the embodiment of FIG. 1B, the output of the step-up network 8 and the output HP of the high-power PA 4 may be directly connected to a load 9, such as an antenna, for example.

Figure 2A:
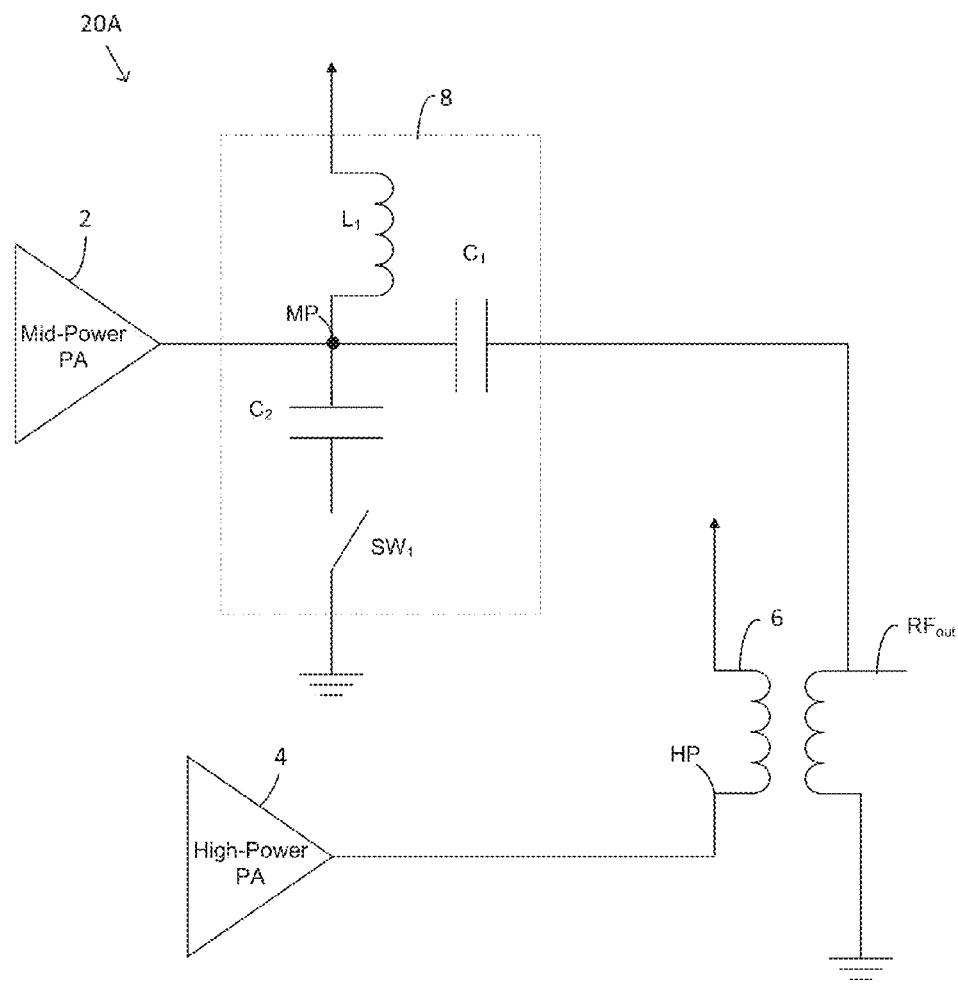
FIG. 2A shows an embodiment of an amplifier circuit in which the output of the step-up network is connected to the output $RF_{out}$ of the balun.
Figure 2B:
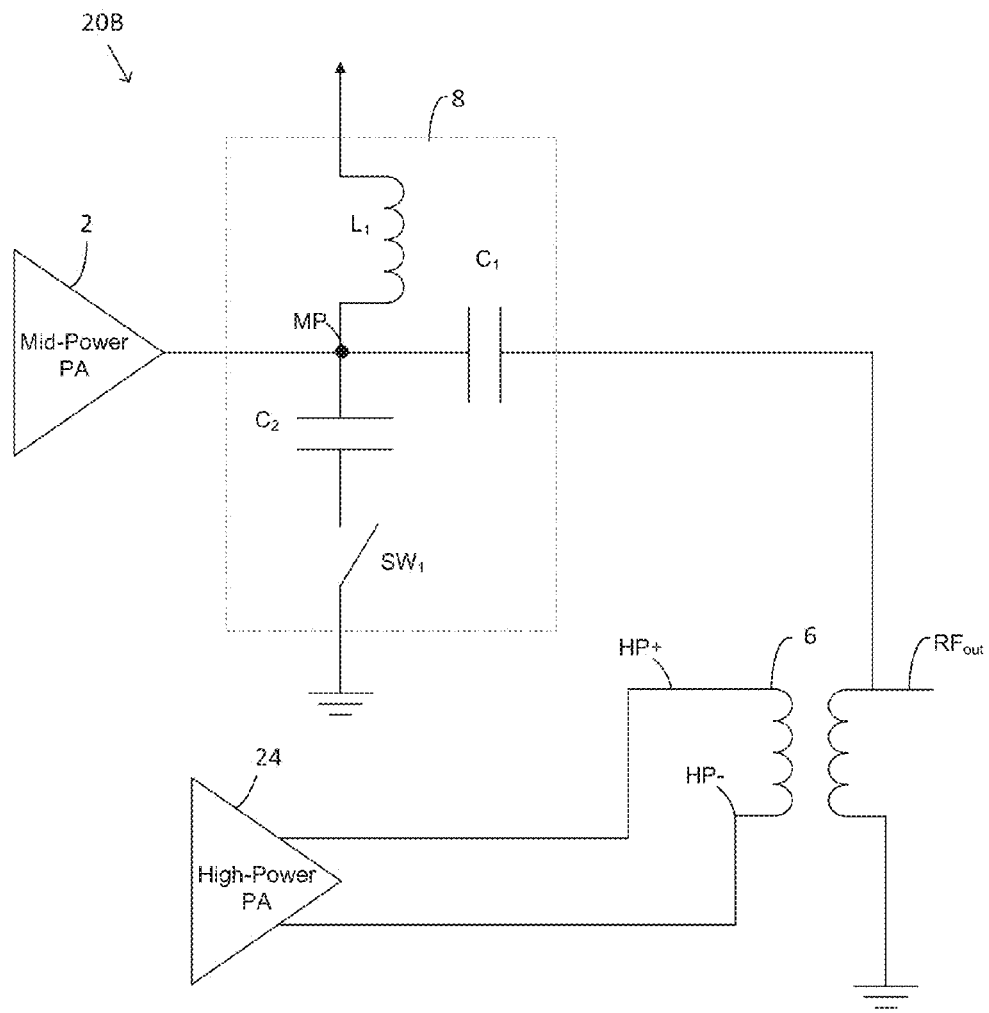
FIG. 2B shows an embodiment of an amplifier circuit similar to FIG. 2A, in which the high-power PA is connected to the input of the balun in a differential configuration.

In some embodiments, the output of the step-up network may be connected to the output $RF_{out}$ of a transformer network (e.g., a balun or LC transformer network). FIG. 2A shows an embodiment of an amplifier circuit 20A in which the output of the step-up network 8 is connected to the output $RF_{out}$ of the balun 6. In FIG. 2A, the high-power PA 4 is connected to the input of the balun 6 in a single-ended configuration. FIG. 2B shows an embodiment of an amplifier circuit 20B similar to FIG. 2A, in which the high-power PA 24 is connected to the input of the balun 6 in a differential configuration. The high-power PA 24 has differential outputs HP+ and HP− connected to respective input terminals of the balun 6.

Figure 3:
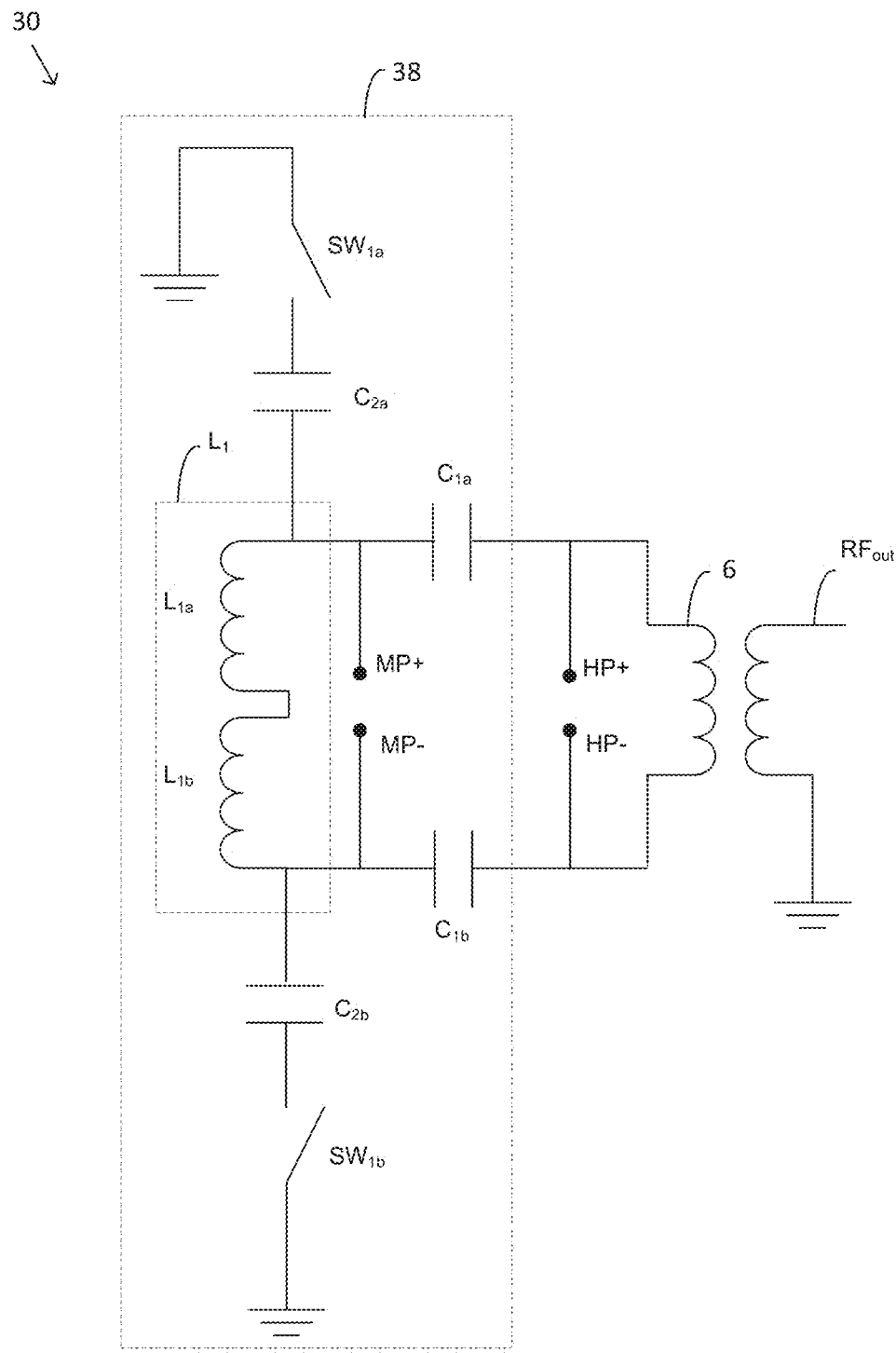
FIG. 3 shows an embodiment of an amplifier circuit similar to FIG. 1A, in which both the mid-power PA and the high-power PA have differential outputs.

FIG. 3 shows an embodiment of an amplifier circuit 30 similar to amplifier circuit 10 of FIG. 1A, in which both the mid-power PA and the high-power PA have differential outputs. The mid-power PA has differential outputs MP+ and MP− and the high-power PA has differential outputs HP+ and HP−. Amplifier circuit 30 includes a differential step-up network 38 having step-up capacitors $C_{1a}$ and $C_{1b}$ and step-up inductors $L_{1a}$ and $L_{1b}$. In some embodiments, step-up inductors $L_{1a}$ and $L_{1b}$ may be a single inductor L1. Similarly, capacitors $C_{1a}$ and $C_{1b}$ can be combined into a single capacitor $C_1$. The step-up network 38 also includes resonant capacitors $C_{2a}$ and $C_{2b}$ and switches $SW_{1a}$ and $SW_{1b}$. Switches $SW_{1a}$ and $SW_{1b}$ are controlled by control circuitry 7.

When the mid-power PA is turned on to drive the load, the high-power PA is turned off. Switches $SW_{1a}$ and $SW_{2a}$ are open, which disconnects resonant capacitors $C_{2a}$ and $C_{2b}$ from the circuit. The step-up capacitors $C_{1a}$ and $C_{1b}$ and step-up inductor(s) $L_{1a}$ and $L_{1b}$ step up the impedance seen by the output of the mid-power PA, as discussed above with respect to FIG. 1A.

When the high-power PA is turned on to drive the load, the mid-power PA is turned off. Switches $SW_{1a}$ and $SW_{2a}$ are closed, which connects resonant capacitors $C_{2a}$ and $C_{2b}$ in parallel with step-up inductor(s) $L_{1a}$ and $L_{1b}$, respectively. The resonant capacitors $C_{2a}$ and $C_{2b}$ resonate with step-up inductor(s) $L_{1a}$ and $L_{1b}$, respectively which prevents the step-up network 38 from loading the outputs HP+ and HP− of the high-power PA.

Figure 4:
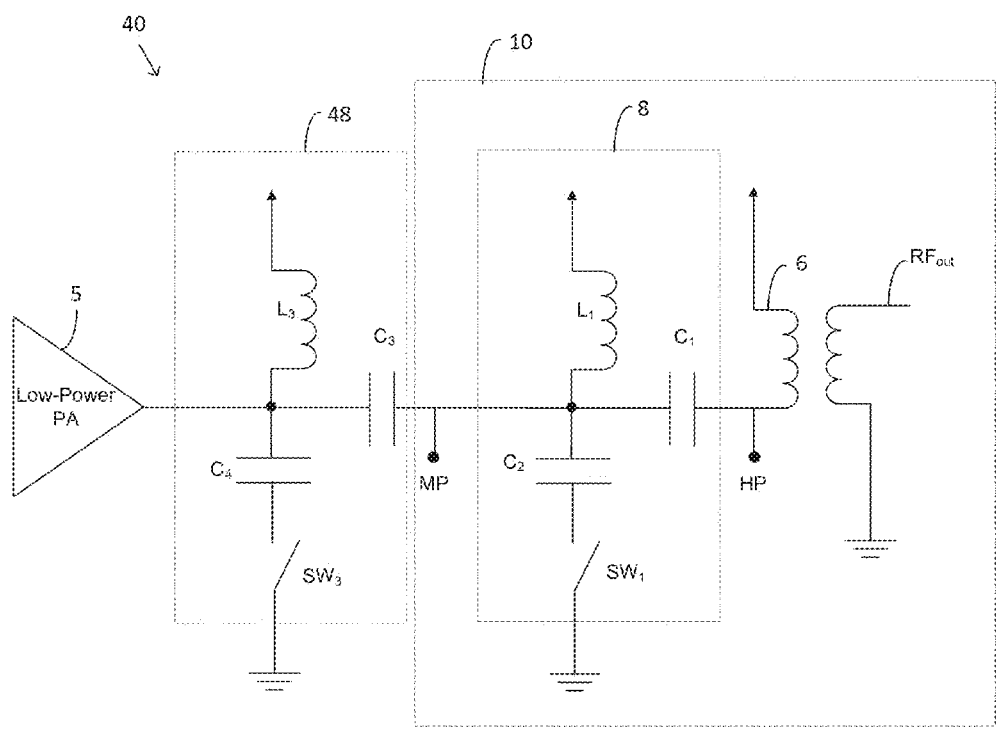
FIG. 4 shows an embodiment of an amplifier circuit that includes cascaded step-up networks.

In some embodiments, step-up networks may be cascaded to present suitable impedances to different amplifiers. FIG. 4 shows an embodiment of an amplifier circuit 40 that includes a low-power PA 5 and a step-up network 48 connected to the input of the step-up network 8. Step-up network 48 may step up the impedance seen at the output of the low-power PA 5 from that seen at the input of the step-up network 8 (looking toward the load). As with step-up network 8, step-up network 48 includes a step-up capacitor $C_3$, a step-up inductor $L_3$, a resonant capacitor $C_4$ and a switch $SW_3$. The switches may be controlled by the control circuitry 7.

When the low-power PA 5 is turned on to drive the load, the mid-power PA and the high-power PA are turned off. Switch $SW_3$ is open, which disconnects capacitor $C_4$ from the circuit. Switch $SW_1$ of step-up network 8 is open, which disconnects capacitor $C_2$. The inductor $L_3$ and capacitor $C_3$ step up the impedance seen by the output of the low-power PA 5. For example, the impedance seen at the input terminal MP of the step-up network 8 may be 100Ω, and the step-up network 48 may increase this impedance by a factor of three so that the output of the low-power PA 5 sees an impedance of 300Ω (looking into the load). As discussed above, stepping up the impedance seen at the output of the low-power PA 5 may increase its efficiency.

When the mid-power PA is turned on to drive the load, the low-power PA 5 and high-power PA are turned off. Switch $SW_3$ is closed, which connects capacitor $C_4$ in parallel with inductor $L_3$. Capacitor $C_4$ resonates with inductor $L_3$, which prevents the step-up network 48 from loading the output of the mid-power PA. As discussed above, switch $SW_1$ of step-up network 8 is open, which disconnects capacitor $C_2$. The inductor $L_1$ and capacitor $C_1$ step up the impedance seen by the output of the mid-power PA, as discussed above.

When the high-power PA 4 is turned on, the low-power PA 5 and mid-power PA 2 are turned off. Switches $SW_1$ is closed, which connects capacitor $C_2$ in parallel with inductor $L_1$. Capacitor $C_2$ resonates with inductor $L_1$, which produces a high impedance that prevents the step-up network 8 from loading the output of the high-power PA. Switch $SW_3$ is also closed, which connects capacitor $C_4$ in parallel with inductor $L_3$. Capacitor $C_4$ resonates with inductor $L_3$, which produces a high impedance that prevents the step-up network 48 from loading the output of the high-power PA through the network 8.

Figure 5:
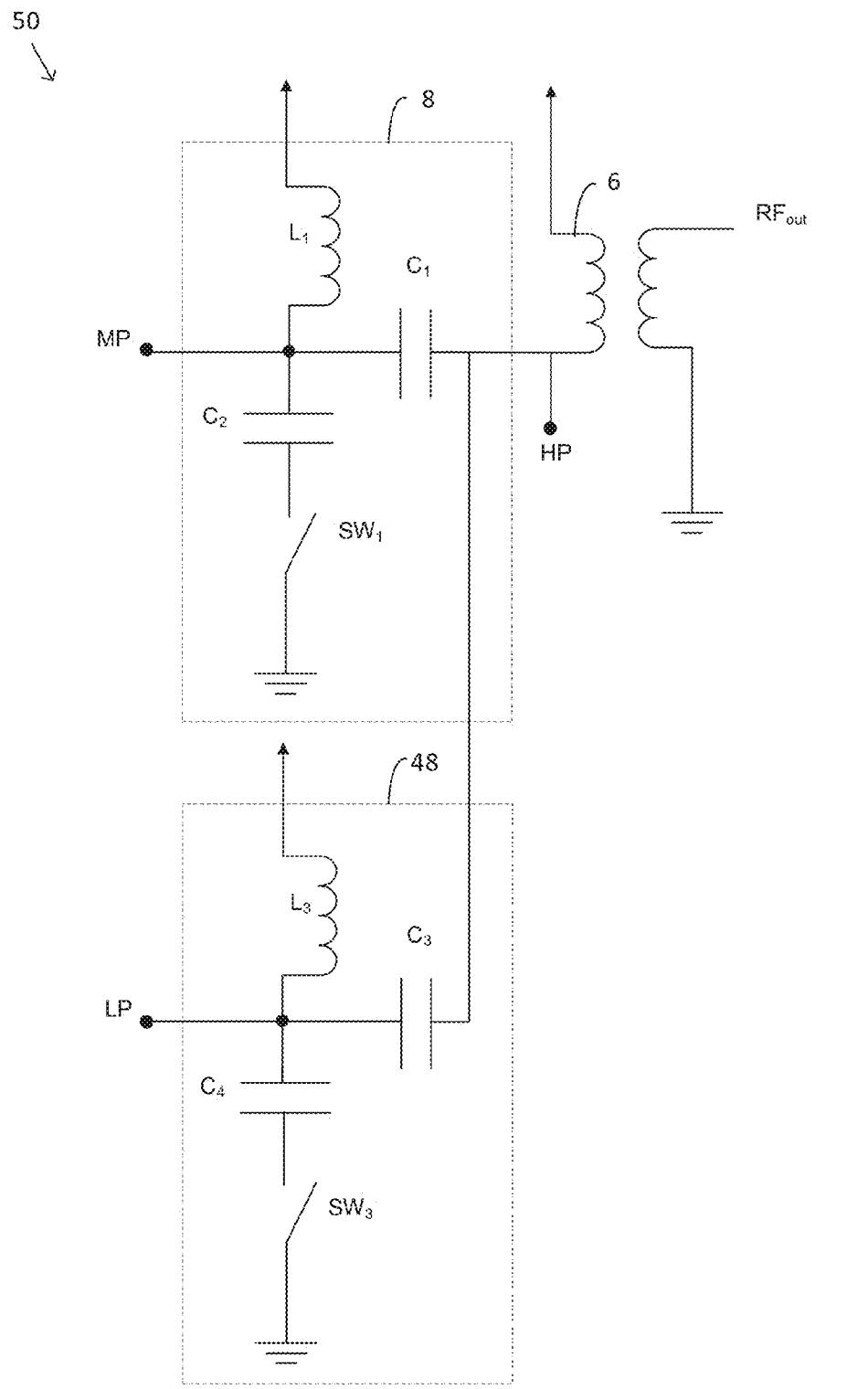
FIG. 5 shows an embodiment of an amplifier circuit in which the output of two step-up networks is connected to the input of a balun.

In some embodiments, step-up networks may be connected such that their outputs are connected to the same node, rather than cascading their inputs and outputs as shown in FIG. 4. FIG. 5 shows an embodiment of an amplifier circuit 50 in which the output of the step-up network 48 is connected to the input of the balun 6, as with the output of the step-up network 8. Since the step-up networks 8 and 48 are not cascaded, the impedance seen by the output of the low-power PA may be different from that seen in the configuration of FIG. 4, since in the embodiment of FIG. 5 the impedance seen by the output of the low-power PA is not stepped up by the step-up network 8. In the embodiment of FIG. 5, the step-up networks may operate as described in the embodiment of FIG. 4. However, since step up network 48 has its output directly connected to the input of the balun 6, switch $SW_3$ is turned on when either the high-power PA or the mid-power PA are turned on. Turing on switch $SW_3$ causes resonant capacitor $C_4$ to resonate with step-up inductor $L_3$, which prevents the step-up network 48 from loading the output of the high-power PA or the mid-power PA. Similarly, switch $SW_1$ is turned on when either the high-power PA or the low-power PA is turned on. Turing on switch $SW_1$ causes resonant capacitor $C_2$ to resonate with step-up inductor $L_1$, which prevents the step-up network 8 from loading the output of the high-power PA or the low-power PA. Switch $SW_1$ is turned off when the mid-power PA is turned on. Switch $SW_3$ is turned off when the low-power PA is turned on.

The techniques described herein can be extended to any number of power amplifiers, and any number of step-up networks. Such networks can be cascaded as shown in FIG. 4, connected to the same output node, as shown in FIG. 5 and/or connected in any other suitable configuration.

The techniques described herein may find application in a variety of technologies. As an example, devices that transmit radio signals for wireless communications may transmit at different power levels depending the distance between the transmitter and the receiver. A power amplifier may be selected depending on the power level needed. For example, the high-power PA may be used to transmit signals at long distances, but may not be necessary or efficient for transmitting signals at smaller distances, in which case a mid-power PA or low-power PA may be used. Minimizing power consumption may be particularly useful for battery powered mobile devices, such as smart phones, tablet computers, laptop computers, etc.

The terms low-power, mid-power and high-power with respect to power amplifiers are relative terms, and do not imply any particular absolute power levels, which may be different for different applications. However, for the examples described herein it should be appreciated that the high-power PA has a higher maximum output power level than a mid-power PA, and the mid-power PA has a higher maximum output power than the low-power PA. In some embodiments, and as described above, a high-power PA is optimized to drive a lower load impedance than a mid-power PA, and a mid-power PA is optimized to drive a lower load impedance than a low-power PA.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An amplifier circuit, comprising:
   a first power amplifier configured to drive a load;
   a second power amplifier configured to drive the load through a first impedance step-up network;
   the first impedance step-up network, wherein the first impedance step-up network is connected to an output of the second power amplifier, the first impedance step-up network being configured to:
   i) switch into a first mode to present an increased impedance to the first power amplifier; and ii) switch into a second mode in which the first impedance step-up network steps up an impedance seen by the second power amplifier looking into the first impedance step-up network;
a third power amplifier configured to drive the load; and
a second impedance step-up network connected to an output of the third power amplifier.

2. The amplifier circuit of claim 1, wherein the first impedance step-up network comprises an inductor and a first capacitor that step up an impedance seen at the output of the second power amplifier looking into the first impedance step-up network when the second power amplifier drives the load.

3. The amplifier circuit of claim 2, wherein the first impedance step-up network further comprises a switch that switches the first impedance step-up network into the first mode to decrease a loading of the first impedance step-up network at an output node of the first power amplifier when the first power amplifier drives the load.

4. The amplifier circuit of claim 3, wherein the first impedance step-up network further comprises a second capacitor configured to be selectively connected in parallel with the inductor with respect to AC signals.

5. The amplifier circuit of claim 4, wherein the second capacitor is in series with the switch.

6. The amplifier circuit of claim 5, wherein the switch turns on to couple the second capacitor in parallel with the inductor with respect to AC signals when the first power amplifier drives the load.

7. The amplifier circuit of claim 4, wherein the second capacitor resonates with the inductor when the first power amplifier drives the load.

8. The amplifier circuit of claim 2, wherein the output of the second power amplifier is connected between the inductor and the capacitor.

9. The amplifier circuit of claim 1, further comprising a transformer network comprising at least one of a balun and an LC transformer network.

10. The amplifier circuit of claim 9, wherein an output of the first impedance step-up network and an output of the first power amplifier are connected to an input of the transformer network.

11. The amplifier circuit of claim 9, wherein an output of the first power amplifier is connected to an input of the transformer network and an output of the first impedance step-up network is connected to an output of the transformer network.

12. The amplifier circuit of claim 11, wherein the output of the first power amplifier is connected to an input of the transformer network in a single-ended or differential configuration.

13. The amplifier circuit of claim 1, wherein the second power amplifier is a differential amplifier having differential outputs and the first impedance step-up network is a differential impedance step-up network connected to receive the differential outputs at respective inputs of the differential impedance step-up network.

14. The amplifier circuit of claim 13, wherein the differential impedance step-up network comprises at least one step-up inductor, at least two step-up capacitors, at least one resonant capacitor and at least one switch connected to the at least one resonant capacitor, the at least two step-up capacitors comprising a first step-up capacitor connected to a first output of the differential amplifier and a second step-up capacitor connected to a second output of the differential amplifier.

15. The amplifier circuit of claim 1, wherein the first power amplifier is a differential amplifier having differential outputs connected to drive the load.

16. The amplifier circuit of claim 1, wherein an output of the second impedance step-up network is connected to an input of the first impedance step-up network.

17. The amplifier circuit of claim 1, wherein an output of the second impedance step-up network is connected to an output of the first impedance step-up network.

18. The amplifier circuit of claim 1, wherein the first power amplifier is configured to drive the load with a first power and the second power amplifier is configured to drive the load with a second power lower than the first power.

19. The amplifier circuit of claim 1, wherein the load comprises an antenna.

20. The amplifier circuit of claim 1, further comprising control circuitry configured to control the first impedance step-up network.

21. A method of operating an amplifier circuit that includes a first power amplifier configured to drive a load, a second power amplifier configured to drive the load through a first impedance step-up network connected to an output of the second power amplifier, and a third power amplifier configured to drive the load through a second impedance step-up network connected to an output of the third power amplifier, the method comprising:
switching the first impedance step-up network into a first mode to present an increased impedance to the first power amplifier; and
switching the first impedance step-up network into a second mode in which the first impedance step-up network steps up an impedance seen by the second power amplifier looking into the first impedance step-up network.

22. The method of claim 21, wherein the first impedance step-up network comprises an inductor, and switching the first impedance step-up network into the first mode comprises connecting a capacitor in parallel with the inductor.

23. The method of claim 22, wherein connecting the capacitor in parallel with the inductor comprises turning on a switch in series with the capacitor.

24. An amplifier circuit, comprising:
a first power amplifier configured to drive a load;
a second power amplifier configured to drive the load through an impedance step-up network;
the impedance step-up network, wherein the impedance step-up network is connected to an output of the second power amplifier, the impedance step-up network being configured to:
i) switch into a first mode to present an increased impedance to the first power amplifier; and
ii) switch into a second mode in which the impedance step-up network steps up an impedance seen by the second power amplifier looking into the impedance step-up network; and
a transformer network comprising at least one of a balun and an LC transformer network.

25. The amplifier circuit of claim 24, wherein an output of the impedance step-up network and an output of the first power amplifier are connected to an input of the transformer network.

26. The amplifier circuit of claim 24, wherein an output of the first power amplifier is connected to an input of the transformer network and an output of the impedance step-up network is connected to an output of the transformer network.

27. The amplifier circuit of claim 26, wherein the output of the first power amplifier is connected to an input of the transformer network in a single-ended or differential configuration.

* * * * *